(12) United States Patent  
Hosoe et al.

(10) Patent No.: US 6,796,808 B2
(45) Date of Patent: Sep. 28, 2004

(54) ELECTRIC JUNCTION BOX (75) Inventors: Katsuhiro Hosoe, Yokkaichi (JP); Hiroyuki Seo, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 10/171,550

(22) Filed: Jun. 17, 2002

(65) Prior Publication Data

US 2002/0197893 A1 Dec. 26, 2002

(30) Foreign Application Priority Data

Jun. 20, 2001 (JP) ........................................ 2001-186796

(51) Int. Cl.[7] .............................................. H01R 12/00
(52) U.S. Cl. ...................... 439/76.2; 439/701; 361/826
(58) Field of Search ............................. 439/76.2, 76.1, 439/621, 830, 701; 361/826, 644, 736, 730, 642

(56) References Cited

U.S. PATENT DOCUMENTS

| | | | | |
|---|---|---|---|---|
| 4,401,351 A | * | 8/1983 | Record ........................ 439/61 |
| 5,515,988 A | | 5/1996 | Oda ............................. 220/38 |
| 5,995,380 A | * | 11/1999 | Maue et al. ................. 361/826 |
| 5,997,362 A | * | 12/1999 | Hatagishi et al. ........... 439/701 |
| 6,008,982 A | * | 12/1999 | Smith .......................... 361/624 |
| 6,116,916 A | * | 9/2000 | Kasai ......................... 439/76.2 |
| 6,162,990 A | * | 12/2000 | Sakamoto .................... 174/59 |
| 6,224,397 B1 | * | 5/2001 | Nakamura .................. 439/76.2 |
| 6,430,054 B1 | * | 8/2002 | Iwata .......................... 361/752 |

* cited by examiner

*Primary Examiner*—Hien Vu  
(74) *Attorney, Agent, or Firm*—Greenblum & Bernstein, P.L.C.

(57) ABSTRACT

A plurality of vertically stacked and detachably connected boxes are provided. Housing portions for insertion of a fuse or/and a relay are provided on one face of boxes, so that all of the faces on which the housing portions are provided in the same direction on either an upper or a lower face in such a condition that when the boxes are stacked, the housing portions are arranged on the opposed faces of the stacked boxes.

7 Claims, 7 Drawing Sheets

ELECTRIC JUNCTION BOX

BACKGROUND OF THE INVENTION

1. Field of the Invention

The present invention relates to an electric junction box that is connected to a wire harness for an automobile, and more particularly, relates to an electric junction box including a plurality of stacked and connected electric junction boxes.

2. Description of Background Information

The number of circuits that are housed inside a junction box or electric connecting box have sharply increased in recent years in accordance with a sharp increase in the electric equipment and the number of components that are mounted on an automobile. The number of parts required for forming high density branched circuits has sharply increased, and the assembly process is more complex and difficult.

Figure 7:
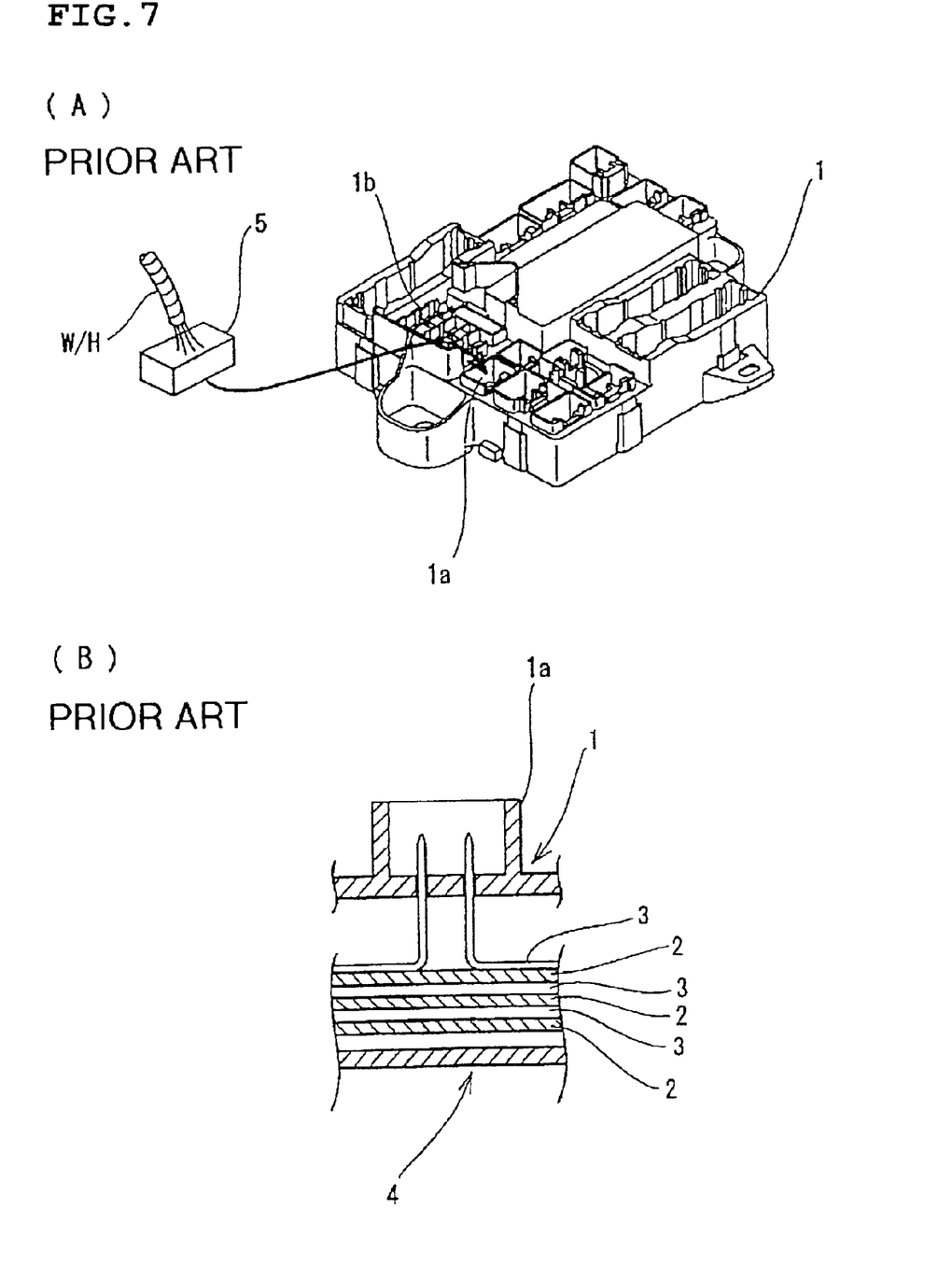
FIG. 7A is a perspective view of a conventional electric junction box.
FIG. 7B is an enlarged sectional view with a portion cut away of the electric junction box of FIG. 7A.

As an example of such a type of junction box, a conventional junction box is illustrated in FIGS. 7A and 7B. The conventional junction box houses internal circuits in which bus bars 3, forming circuits by stamping an electroconductive material, and insulation boards 2 are alternately stacked inside the junction box. The junction box includes an upper case 1 and a lower case 4. A connector housing portion 1a, a fuse housing portion 1b, a relay housing portion, and the like are provided on the upper face of the upper case 1. An external circuit is electrically connected to the bus bars 3 by fitting the connector 5 at the end of a wire harness W/H in the connector housing portion 1a.

However, since the fuse and relay are installed only on the upper face of the upper case 1 in the conventional junction box, installation space is limited, and there is the problem that an increase in the number of fuses and relays cannot be accommodated. To overcome this problem, the area in the horizontal direction of the junction box may be enlarged, or the housings for the fuses and relays may be provided on the lower face as well as the upper face of the junction box to enlarge the installation space for the components. However, it is difficult to enlarge the horizontal area of the junction box because the space available for the junction box in an automobile is often limited in the horizontal direction. Further, providing housings for the fuses and relays on both the upper and lower faces of the junction box requires assembly and maintenance in both sides of the junction box, so that maintenance may be performed only by overturning the junction box, making maintenance difficult and problematic.

SUMMARY OF THE INVENTION

The present invention was developed to solve the above and other problems. An object of the present invention is to avoid an increase in the size of the junction box, to ease and simplify maintenance, and to provide a large installation area for the components.

In order to solve the above described problems, an electric junction box is provided including a plurality of boxes detachably connectable in vertically stacked layers, and housing portions in which a fuse and/or a relay is connectedly inserted on one face of at least two or more junction boxes, such that the faces provided with fuses and/or relays of the stacked boxes all point in the same direction, such as either an upper or a lower direction, and the housing portions of the fuse and/or the relay are positioned between one face of a box and an adjacently stacked box.

When this construction is provided, since the housing portions are on one side of a box and face in the same direction, a worker can carry out the installation and removal of a fuse and/or relay from one side, and maintenance is improved and made convenient.

For example, when the above described electric junction box is mounted on a vehicle, relay and fuse housing portions of the stacked boxes are positioned facing the opening portion for maintenance of a vehicle, so that the housing portions always face the opening portion upon removal of the outermost box. Therefore, convenience and access is remarkably improved because it is not necessary to turn the box over and remove it from the vehicle.

Further, since the fuse and relay housing portions are provided on only one face of at least two or more of boxes, the number of components can be greatly increased without increasing the horizontal space required by the electric junction box in a vehicle.

Further, since the above described electric junction box is divided into a plurality of boxes, a flexible circuit design is possible. For example, even if variation of a circuit is required, it may be changed without changing the entire electric junction box by providing a box which houses a basic circuit having less variation and a box which houses a circuit (or an optional circuit) in which a variation is anticipated. Further, a box housing a circuit may be divided depending on the location of a circuit load, and the like. Therefore various designs become possible.

The above described stacked boxes may include any suitable number of boxes, such as for example, two to ten boxes, the locking portion and the catch portion are provided on an outer face of the respective boxes, and the locking portion and the catch portion of the adjacent boxes are detachably locked. Therefore assembly is easily performed with one touch, and removal at maintenance can be easily performed.

The above described stacked boxes are provided with an internal circuit consisting of any suitable components, such as, for example, bus bars, a single core wire, a flat harness and/or a printed circuit board inside a case including a lower case and an upper case, and the internal circuitry of the stacked boxes is electrically connected through an internal circuit-connecting portion provided on the opposing faces of adjacent boxes.

Since the internal circuit-connecting portions between the respective boxes are provided at the opposing faces of the respective boxes, the connecting portions are covered after stacking the respective boxes, therefore safety, treatment, appearance and the like are improved in comparison with connecting by electric wires or the like at the outer faces of the electric junction boxes.

Further, the conductor in the above described internal circuitry may include any of either bus bars, a single core wire, or a flat cable, or a combination thereof. Further, the internal circuit may include a printed circuit board.

The connector portion may be provided on opposing faces of the adjacent boxes, the connector portion may be fitted, and the terminals of the internal circuit which extend inside are detachably connected. Therefore the electrical connection between the respective boxes can be obtained by one touch at the same time as stacking the respective boxes, and removal thereof can be easily carried out.

Alternatively, in place of the above described connector connection, the relay terminals connected to the internal circuit may extend from opposing faces of adjacent boxes, a recess may be provided on the opposing faces, and the relay terminals may be inserted into the recess and detachably connected to the internal circuit. In this case, it is not required to form a connector housing.

Alternatively, in place of the above described connector connection and relay terminal connection, there may be contact pieces connected to the internal circuit arranged on opposing faces of the adjacent boxes, and the adjacent boxes may be connected by a bolt screwed into the case through a bolt hole, and the internal circuits are connected through the contact pieces at the same time as connecting the boxes.

A connector connected to the wire harness of an external circuit may be provided on the upper faces of the stacked boxes or/and the lower faces or/and the side faces of the respective boxes, and may be provided at a position at which it is easily connected with the connector of the wire harness.

Further, the wire harness of the external circuit may be inserted inside a box without a connector, and the conductor of the internal circuit may include electric wires.

According to an aspect of the present invention, an electric junction box is provided including a plurality of boxes, each of the boxes including an upper face and a lower face, the plurality of boxes being stacked in vertical layers and detachably connectable to each other so that the upper face of one of the boxes is adjacent the lower face of the next adjacent box, and a least one housing portion provided on one face of at least two of the plurality of boxes, the housing portions configured to receive a component; wherein the plurality of boxes are vertically stacked so that all of the components received in the housing portions of the boxes face in one direction and the components are positioned between the upper face of the box in which it is received and the lower face of the next adjacent box. The plurality of boxes may include two to ten boxes.

According to a further aspect of the present invention, The each of the boxes may include an upper case, a lower case, and an internal circuit including one or more bus bars, single core wires, flat harnesses or printed circuit boards inside the case, and wherein the internal circuits of the boxes are electrically connected to each other through an internal circuit connecting portion provided on opposing faces of adjacent boxes. The connector portions may be provided on the cases on opposing faces of the boxes, the connector portions being fitted to each other so that terminals on the internal circuits extending into the connector portions are detachably connected to each other. Further, a relay terminal may extend from a respective case of one of the boxes, and an aperture may be provided in the case of an adjacent box so that the relay terminal is inserted into the aperture and the relay terminal is detachably connected to the internal circuit in the case of the adjacent box.

In a further aspect of the present invention, the electric junction box includes contact pieces connected to an internal circuit on the cases of opposing faces of the adjacent boxes, and the adjacent boxes are connected by a bolt screwed into the case through a bolt hole so that the internal circuits of the adjacent boxes are connected to each other by the contact pieces and the adjacent boxes are connected to each other. The connector connected to a wire harness of an external circuit may be provided at the upper face, the lower face or a side face of the respective boxes. Further, the housing portions may be configured for receipt of a fuse or a relay, and the housing portions may be positioned on an outer face of the stacked boxes so as to face outwardly for maintenance. The electric junction box may further include a locking portion and a catch portion at outer faces of adjacent boxes so that the locking portion and the catch portion of adjacent boxes are detachably locked.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
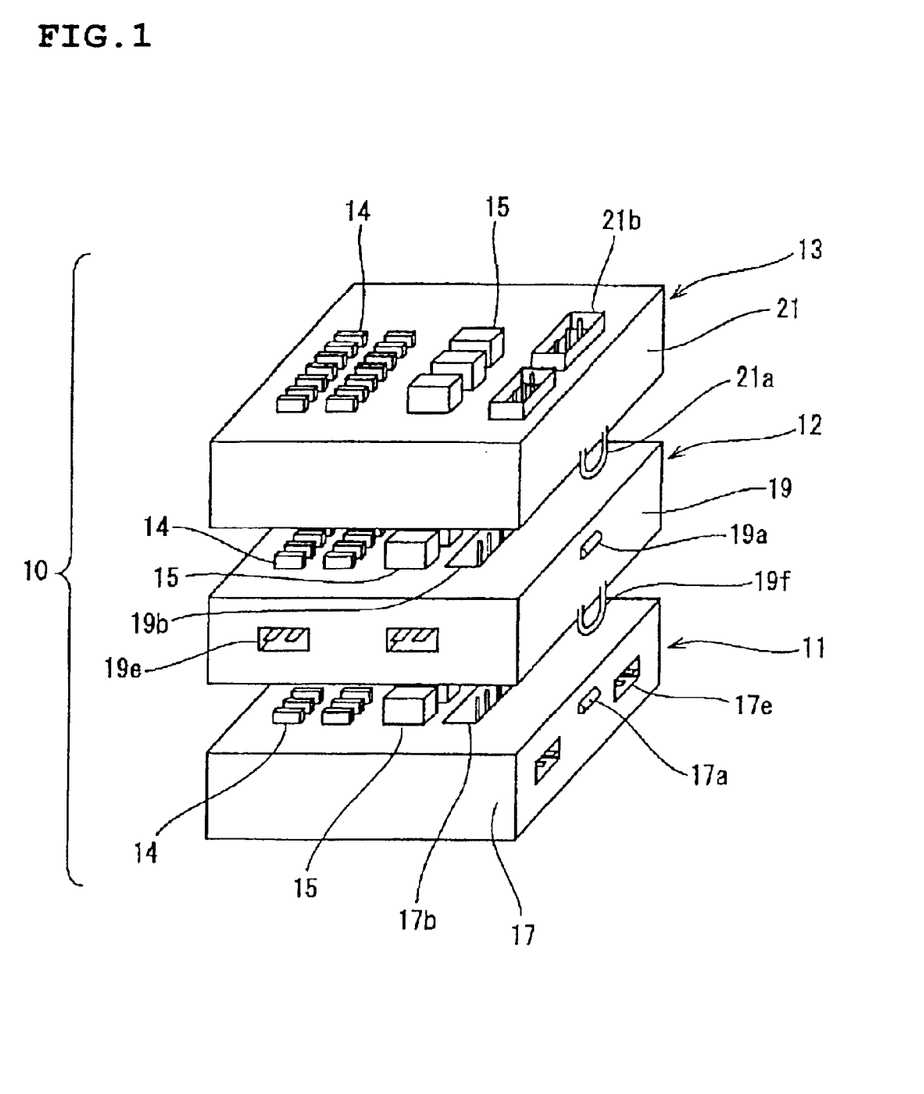
FIG. 1 is an exploded perspective view of an electric junction box according to a first embodiment of the present invention.
Figure 2:
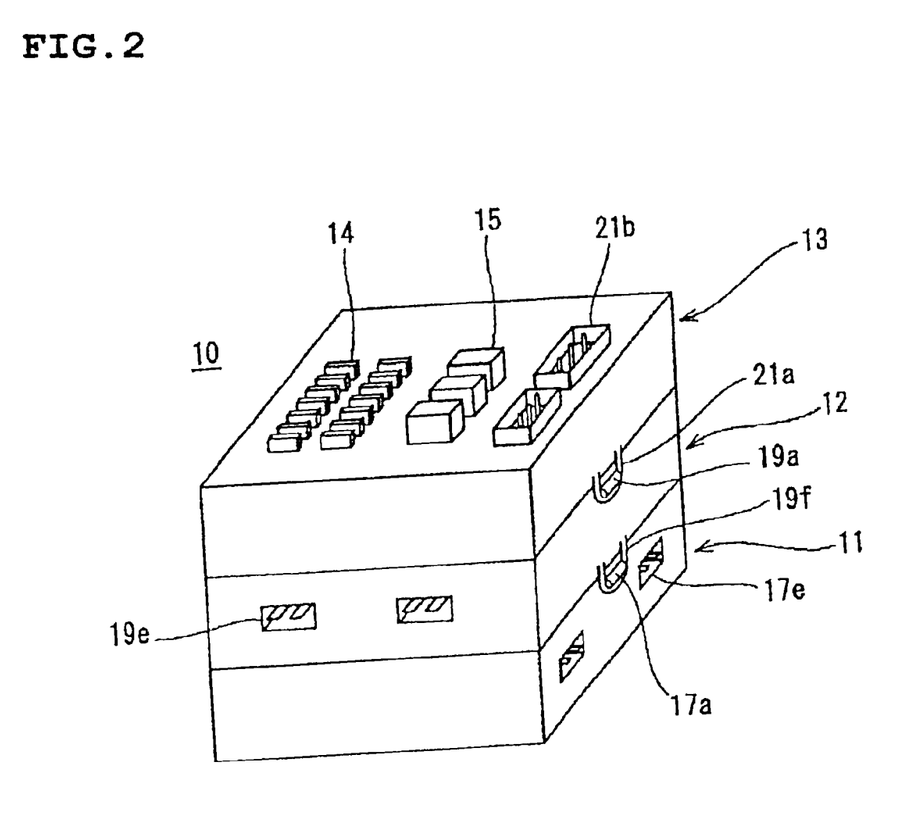
FIG. 2 is a perspective view of the electric junction box of FIG. 1.
Figure 3:
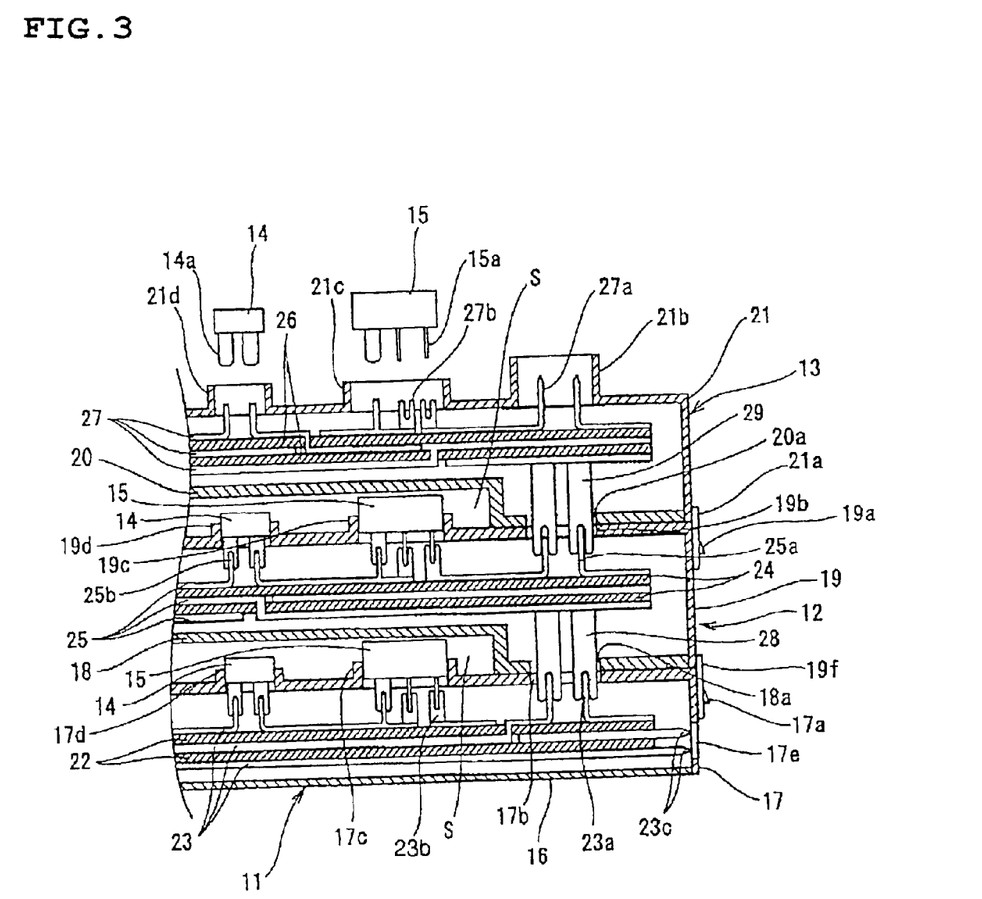
FIG. 3 is a schematic sectional view with a portion cut away of the electric junction box of FIG. 1.

The details and operation of the present invention is illustrated with reference to the drawings. An embodiment of the present invention is illustrated in FIG. 1 to FIG. 3.

A junction box or electric connecting box 10 is constructed by stacking a plurality of boxes, e.g., three boxes 11, 12, and 13 to be locked. Each of the boxes 11, 12, and 13 houses internal circuitry inside a case including an upper case 17, 19, 21 and a lower case 16, 18, 20, respectively.

The first box 11 of the lower layer houses internal circuitry, the bus bars 23 and the insulation boards 22, alternately stacked, and is provided with an aperture 17b for the relay connection, a relay housing portion 17c, and a fuse housing portion 17d on the upper face of the upper case 17. The first box 11 is provided with an aperture 17e for an external circuit connection, and a catch portion 17a including, for example, a protrusion, on a side face of the upper case 17. The present invention includes locking mechanisms between the boxes that may take any form, and in the present embodiment includes a catch portion and a hooking member as shown in FIGS. 1–3.

The internal circuitry formed by the bus bars 23 forms the basic circuit that is common to all types of automobiles. Tabs 23*a* or the press connection tabs 23*b* extend into the aperture 17*b*, the relay housing portion 17*c*, and the fuse housing portion 17*d*. Bus bar edges 23*c* are positioned horizontally at the side face aperture 17*e* of the upper case 17 and are configured to be connected to a connector (not illustrated) of the external circuit.

The second box 12 of the intermediary layer houses the internal circuitry, the bus bars 25 and the insulation board 24, alternately stacked in like manner to the first box 11, is provided with an aperture 19*b* for the relay connection, a relay housing portion 19*c*, and a fuse housing portion 19*d* on the upper face of the upper case 19. The second box 12 is provided with an aperture 19*e* for an external circuit connection, a frame shaped locking portion 19*f* that extends in a downward direction, and a catch portion 19*a* including, for example, a protrusion at the side face of the upper case 19. Further, an aperture 18*a* for the relay connection is provided on the lower face of the lower case 18, and the lower case 18 itself has a recessed shape so that the fuse 14 and the relay 15 of the first box are accommodated between the boxes 11 and 12.

The internal circuitry of the optional circuit is formed by bus bars 25. Tabs 25*a* or press connection tabs 25*b* extend into the aperture 19*b*, the relay housing portion 19*c*, and the fuse housing portion 19*d*. The relay terminal 28, having one end connected to the bus bars 25 and a press connection slot at the other end extends in a downward direction from the aperture 18*a*.

The third box 13 of the upper layer houses the internal circuitry, including the bus bars 27 and the insulation board 26, alternately stacked in like manner to the second box. The lower case 20 has a recessed shape, and is provided with an aperture 20*a* for the relay connection. A connector housing portion 21*b*, a relay housing portion 21*c*, and a fuse housing portion 21*d* are provided on the upper face of the upper case 21. A frame shaped locking portion 21*a* extends in a downward direction from the side face of the upper case 21.

The internal circuitry formed by the bus bars 27 forms the optional circuit which has a high incidence of change. Tabs 27*a* or the press connection tabs 27*b* extend into a connector housing portion 21*b*, a relay housing portion 21*c*, and a fuse housing portion 21*d*. A relay terminal 29 having one end connected to the bus bars 27 and a press connection slot at the other end extends in a downward direction from an aperture 20*a*.

When the second box 12 is stacked on the upper face of the first box 11, the relay terminal 28 extending from the lower face of the second box 12 is inserted into the upper aperture 17*b* of the first box 11, and is press connected to the tab 23*a*, and the locking portion 19*f* is locked with the catch portion 17*a*.

Further, the fuse 14 and the relay 15 on the upper face of the first box 11 are positioned in the space S that is formed by constructing the lower case 18 of the second box 12 in a recessed shape.

Then, the third box 13 is stacked on the upper face of the second box 12 in like manner to the second box 12 on the first box 11 so that the three boxes 11, 12 and 13 are vertically stacked and form the junction box 10. In the junction box 10, there is provided electrical connection between the boxes by the relay terminals 38 and 39.

Since all of the housing portions 17*c*, 19*c* and 21*c* of the relays 15 and the housing portions 17*d*, 19*d* and 21*d* of the fuses 14 of the respective boxes 11, 12 and 13 are provided on upper faces of the boxes, a worker can perform the installation and removal of the fuses 14 and the relays 15 from a single, upper direction for maintenance, and maintenance is improved.

Further, since the housing portions 17*c*, 19*c* and 21*c* of the relays 15 and the housing portions 17*d*, 19*d* and 21*d* of the fuses 14 are provided in the vertically stacked boxes, the number of fuses 14 and relays 15 that can be mounted can be sharply increased without increasing the area required by the junction box 10 in a vehicle.

Further, the basic circuitry which is common to all types of automobiles is mounted in the first box 11, and the optional circuits are mounted in the second box 12 and the third box 13. Therefore, even though specification changes may occur, such changes can be made without changing the entire junction box 10, and total cost can be reduced.

Figure 4:
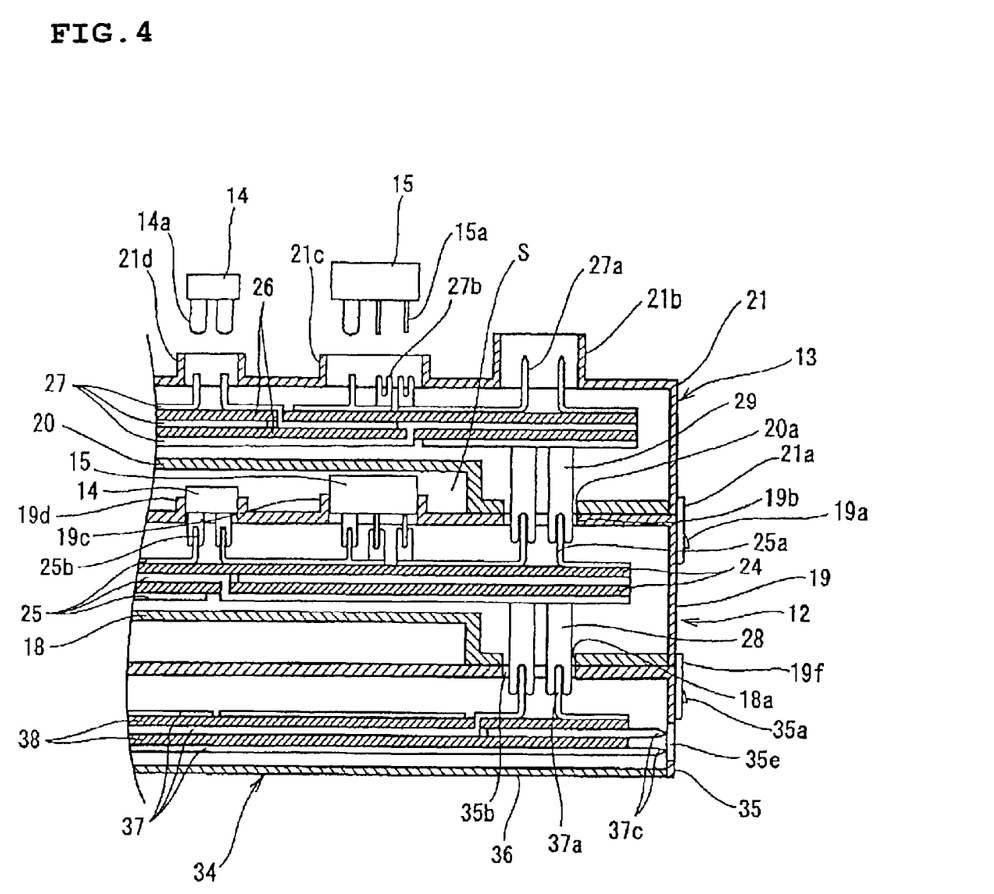
FIG. 4 is a schematic sectional view with a portion cut away of a modified example of the electric junction box of FIG. 1.

In the modified example of the first embodiment shown in FIG. 4, the junction box 10 may be constructed so that the first box 34 of the lower layer is not provided with the housing portions for a fuse and a relay, and only the upper faces of the second box 12 and the third box 13 are provided with fuse housing portions 19*d* and 21*d* and relay storing portions 19*c* and 21*c*. In this case, press connection tabs for connection to a fuse relay do not extend from the bus bars 38 of the upper layer of the internal circuitry in the lower box 11.

Further, since the construction of the modified example of FIG. 4 is similar to the first embodiment, the first box 34 is denoted by different reference numerals and the same reference numerals are used for the second box 12 and the third box 13, in both the first embodiment and the modified example.

Further, as is clearly shown in FIG. 4, the first box in the modified example is not provided with housing portions for a fuse and a relay, and in the modified example, only the second box and the third box are provided with housing portions for a fuse and a relay.

Figure 5:
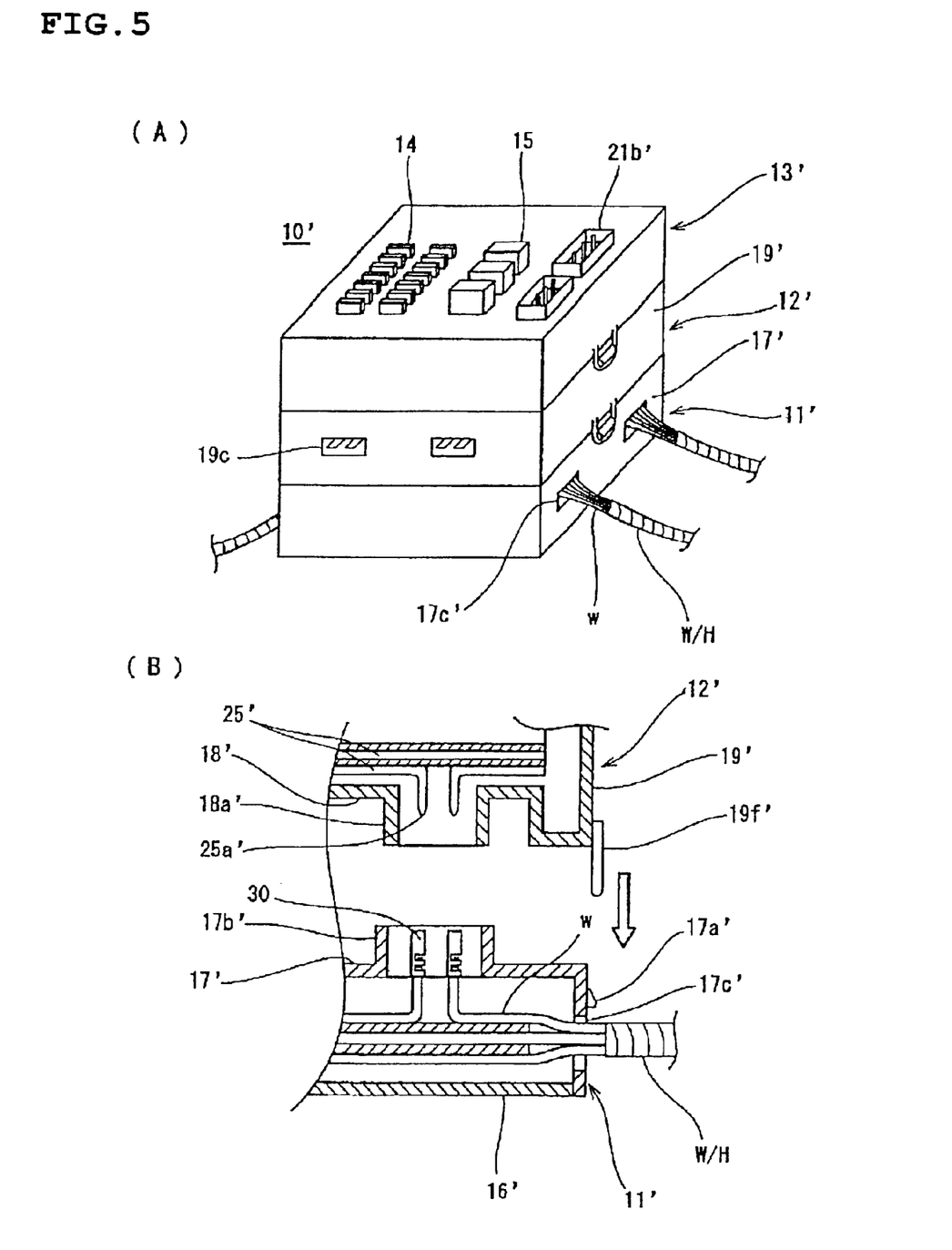
FIG. 5A is a perspective view of an electric junction box, according to a second embodiment of the present invention.
FIG. 5B is an enlarged sectional view with a portion cut away of the electric junction box of FIG. 4.

A second embodiment of the present invention is shown in FIG. 5. A difference between the first embodiment and the second embodiment is that the electric wires w of the wire harness W/H are directly connected to the internal circuitry of the first box 11', and the electric connection between the first box 11' and the second box 12' is provided by connector portions in opposing faces of the cases.

In the junction box 10' of the second embodiment of the present invention, the electric wires w of the wire harness W/H pass through an installation hole 17*c*' at the side face of the first box 11' and are directly connected to the bus bars without a connector to form the internal circuitry. The junction box 10' is provided with a connector housing portion 17*b*' on the upper face of the upper case 17', and houses a terminal 30 which is press clamped to the ends of the electric wires w.

The internal circuitry of the second box 12' is formed by the bus bars 25', and tabs 25' of the bus bars 25' are housed in the connector portion 18*a*' that is provided in the lower case 18'.

When the second box 12' is stacked on the upper face of the first box 11', the connector portion 18*a*' of the lower face of the second box 12' is internally fitted inside the connector housing portion 17*b*' of the first box 11, and thereby the terminal 30 is press connected to the tab 25*a*', and the locking portion 19*f* is locked with the catch portion 17*a*' on the side face of the case.

Further, this construction is similar to the first embodiment and the electric connection of the second box 12' to the third box 13' may be provided by a connector connection in like manner as described above.

Further, the wire harness W/H is shown in only the first box 11' without a connector, but alternatively, but may be inserted inside the second box 12' or/and the third box 13' without a connector.

Figure 6:
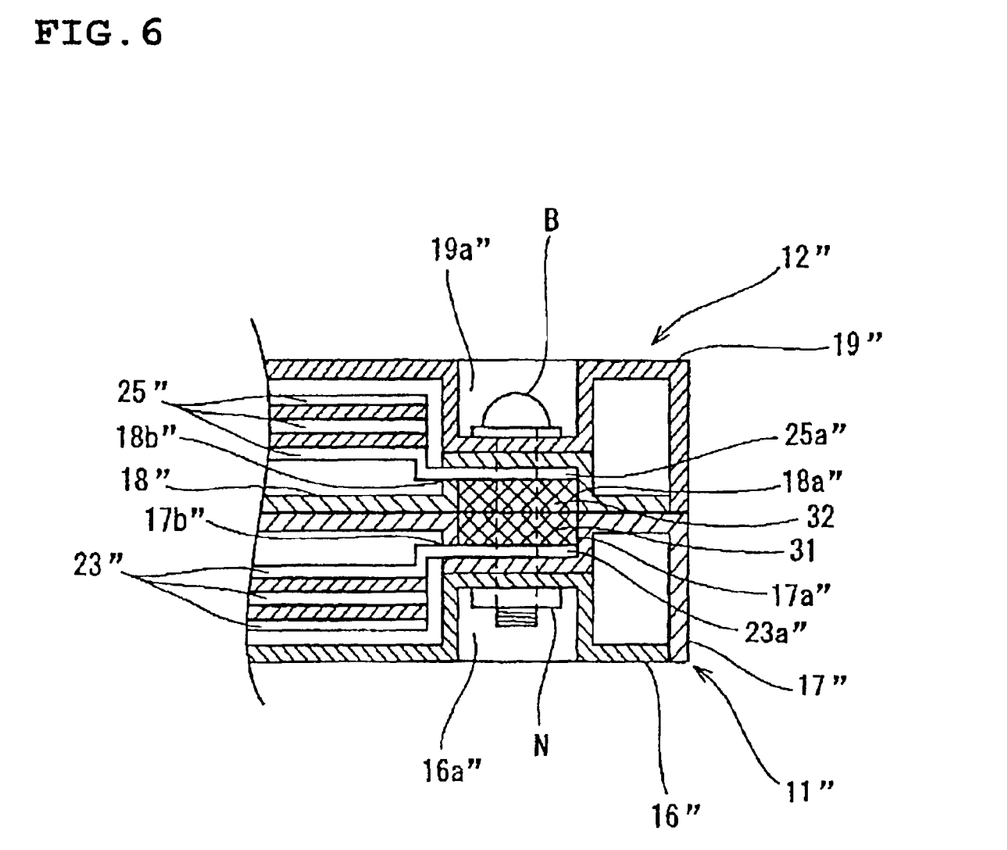
FIG. 6 is an enlarged sectional view with a portion cut away of an electric junction box of a third embodiment of the present invention.

A third embodiment of the present invention is shown in FIG. 6.

A difference between the first and second embodiments is that the electric connection between boxes is provided by bolting the first box 11" and the second box 12" together other with the bolt B. Any suitable bolt or fastening device known to those skilled in the art may be utilized.

The first box 11" is provided with an upper recessed portion 17a" in the upper case 17" and a lower recessed portion 16a" in the lower case 16", and exposes the one end 23a" of the bus bars 23" of the internal circuit on the upper recessed portion 17a" by inserting the slit 17b" of the upper case 17".

The second box 12" is provided with an upper recessed portion 19a" in the upper case 19" and a lower recessed portion 18a" in the lower case 18", and exposes the one end 25a" of the bus bars 25" of the internal circuit on the lower recessed portion 18a" by inserting the slit 18b" of the lower case 18".

Further, bolt holes (dotted line in the drawing) are provided by drilling at the same axial position in the upper recessed portions 17a" and 19a", the lower recessed portions 16a" and 18a", and the one end 23a" and the one end 25a" of the bus bars 23", 25".

Contact pieces 31 and 32 each of which have a bolt hole are positioned in a space formed by the upper recessed portion 17a" of the first box 11" and the lower recessed portion 18a" of the second box 12", and the bolt B is screwed in from the upper recessed portion 19a" of the second box 12" and fixed at the lower recessed portion 16a" by a nut N.

When this construction is provided, the bus bars 23" of the first box 11" and the bus bars 25" of the second box 12" are electrically connected through the contact pieces 31 and 32, and the internal circuits are connected to each other.

Further, since the connection between the respective boxes 11" and 12" is already made by the bolting, a locking portion and a locked portion are not required on the outer face of the cases.

Further, construction is similar to the first embodiment and the electric connection of the second box 12" to the third box 13" may be carried out by the bolting connection or the above mentioned connector connection in like manner as described above.

As is clear from the above description, according to the present invention, since the housing portions of the fuses and the like of the respective boxes are provided on the same side of the case, the installation and removal of fuses and the like can be performed from a single direction for maintenance and the like, and maintenance is improved. The housing portions of the fuses and the like are provided at faces of the respective boxes, and therefore the number of fuses that may be mounted on the box can be increased.

Further, since the boxes are vertically stacked, it is not required to increase the space required in a vehicle in the horizontal direction. Since the cases are locked and stacked, installation and removal become easy.

Further, since the electric junction box described above is divided into boxes, a flexible circuit design is possible, circuits may be varied without changing the entire electric junction box.

Since the internal circuit connections between the respective boxes are formed at the opposing faces of the cases by a connector, a relay terminal or a bolting terminal, safety, treatment property, appearance and the like can be improved.

Further, the connector housing portion of the above described electric junction box can be provided at a position at which it is easily connected with the connector of the wire harness W/H and the installation efficiency is improved.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

The present disclosure relates to subject matter contained in priority Japanese Application No. JP2001-186796, filed on Jun. 20, 2001, which is herein expressly incorporated by reference in its entirety.

What is claimed is:

1. An electric junction box including:

a plurality of boxes, each of said boxes including an upper face and a lower face, said plurality of boxes being stacked in vertical layers and detachably connectable to each other so that the upper face of one of the boxes is adjacent the lower face of the next adjacent box; and at least one housing portion provided on one face of at least two of said plurality of boxes, said housing portions configured to receive a component; wherein said plurality of boxes are vertically stacked so that all of the components received in said housing portions of said boxes face in one direction and so that the components received in said housing portions of said boxes are positioned between the upper face of the box having the housing portion in which the component is received and the lower face of the box directly there above in the stack.

2. The electric junction box according to claim 1, wherein said plurality of boxes includes two to ten boxes.

3. The electric junction box according to claim 1, wherein said internal circuit connecting portions are provided on said cases on opposing faces of said boxes, said connecting portions being fitted to each other so that terminals on said internal circuits extending into said connector portions are detachably connected each other.

4. The electric junction box according to claim 1, wherein a relay terminal extends from a respective case of one of said boxes, and an aperture is provided in the case of an adjacent box so that said relay terminal is inserted into said aperture and said relay terminal is detachably connected to the internal circuit in the case of said adjacent box.

5. The electric junction box according to claim 1, wherein a connector connected to a wire harness of an external circuit is provided at the upper face, the lower face or a side face of said stacked boxes.

6. The electric junction box according to claim 1, wherein said housing portions are configured for receipt of a fuse or a relay, and said housing portions are positioned on an outer face of said stacked boxes so as to face outwardly for maintenance.

7. The electric junction box according to claim 1, wherein a locking portion and a catch portion are provided on side faces of adjacent boxes so that said locking portion and said catch portion of adjacent boxes are detachably locked.

* * * * *